US006545462B2

United States Patent
Schott et al.

(10) Patent No.: US 6,545,462 B2
(45) Date of Patent: *Apr. 8, 2003

(54) SENSOR FOR THE DETECTION OF THE DIRECTION OF A MAGNETIC FIELD HAVING MAGNETIC FLUX CONCENTRATORS AND HALL ELEMENTS

(75) Inventors: Christian Schott, Morges (CH); Robert Racz, Zug (CH); Radivoje Popovic, St-Sulpice (CH)

(73) Assignee: Sentron AG, Zug (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/924,899

(22) Filed: Aug. 8, 2001

(65) Prior Publication Data

US 2002/0021124 A1 Feb. 21, 2002

(30) Foreign Application Priority Data

Aug. 21, 2000 (CH) ................................................ 1645/00

(51) Int. Cl.⁷ ............................. G01B 7/24; G01R 33/07
(52) U.S. Cl. .............................. 324/207.2; 324/207.25; 324/251
(58) Field of Search .............................. 324/235, 207.2, 324/207.25, 251, 252, 173, 174, 207.21; 327/511; 338/32 H, 32 R; 257/421; 73/514.31; 310/68 B

(56) References Cited

U.S. PATENT DOCUMENTS

| 5,572,058 A | 11/1996 | Biard ........................... 257/421 |
| 5,874,848 A | * 2/1999 | Drafts et al. ................. 327/511 |
| 5,942,895 A | 8/1999 | Popovic et al. ............. 324/251 |
| 6,064,197 A | 5/2000 | Lochmann et al. .... 324/207.14 |
| 6,184,679 B1 | 2/2001 | Popovic et al. ............. 324/251 |

FOREIGN PATENT DOCUMENTS

EP        0 954 085 A1        4/1998

* cited by examiner

Primary Examiner—Edward Lefkowitz
Assistant Examiner—Reena Aurora
(74) Attorney, Agent, or Firm—McCormick, Paulding & Huber LLP

(57) ABSTRACT

A sensor for the detection of the direction of a magnetic field comprises one single magnetic field concentrator with a flat shape and at least a first horizontal Hall-effect element and a second horizontal Hall-effect element, whereby the Hall-effect elements are arranged in the area of the edge of the magnetic field concentrator. Within its environment, the magnetic field concentrator alters the course of the field lines of the magnetic field and, in particular, has the effect that the field lines which, in the absence of the magnetic field concentrator would run parallel to the surface of the Hall-effect elements penetrate the Hall-effect elements almost vertically to their surface. Instead of horizontal Hall-effect elements, vertical Hall-effect elements can also be used when they are arranged beside the magnetic field concentrator. The sensor is particularly suitable as an angle sensor.

18 Claims, 3 Drawing Sheets

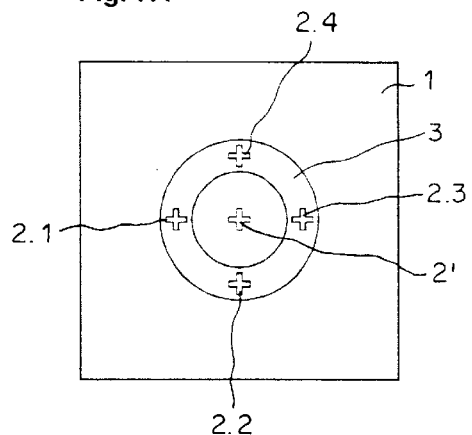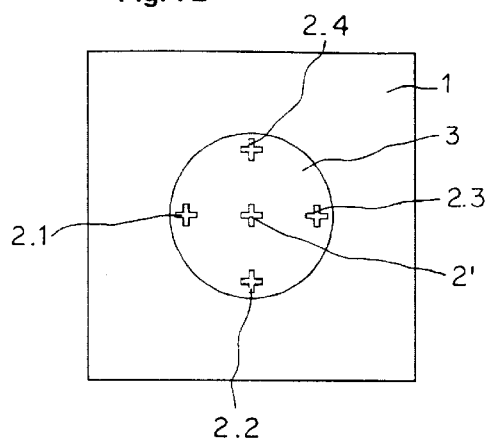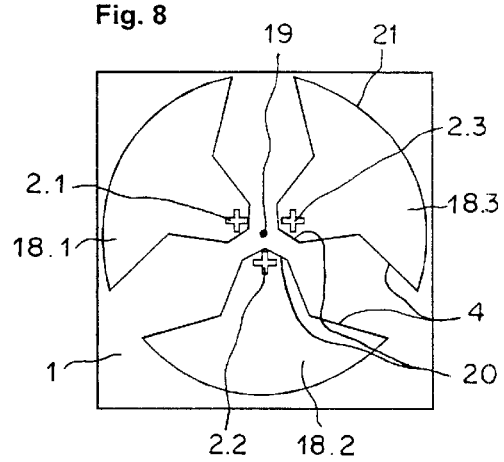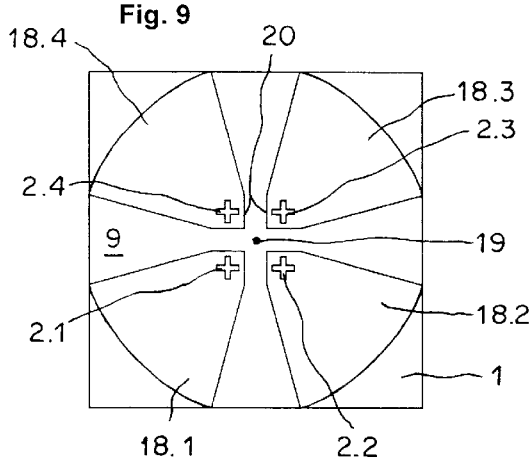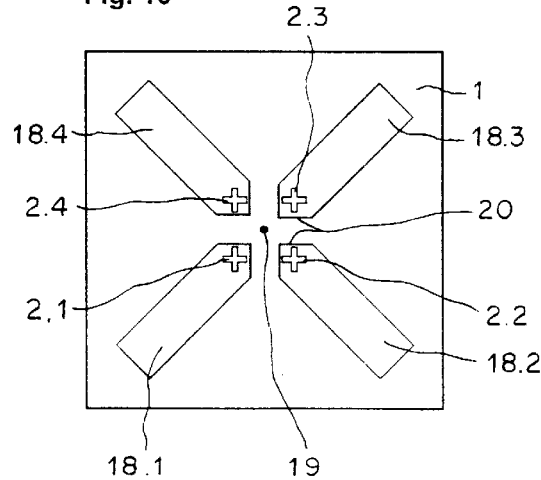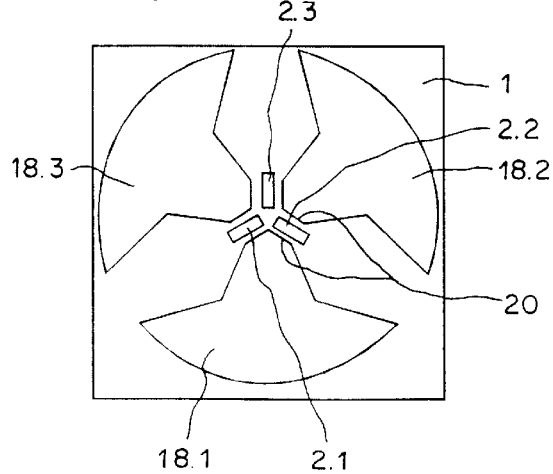

US 6,545,462 B2

Figure 1:
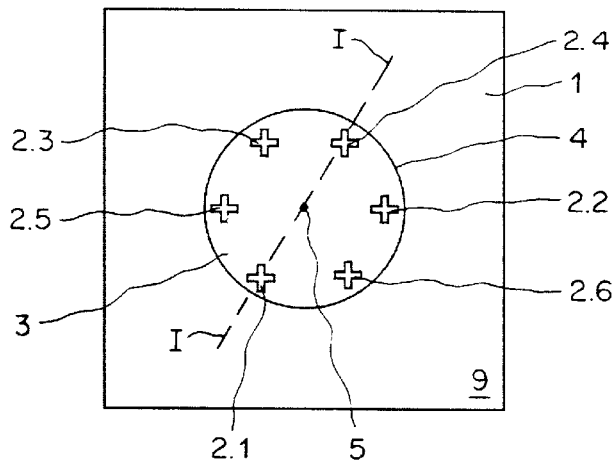

SENSOR FOR THE DETECTION OF THE DIRECTION OF A MAGNETIC FIELD HAVING MAGNETIC FLUX CONCENTRATORS AND HALL ELEMENTS

BACKGROUND OF THE INVENTION

Such a sensor is suitable for example as an angle sensor for the control of brushless electric motors which have a stator Comprising several coils. The rotor of the electric motor has a permanent magnet which combines with the sensor to produce an angle of rotation dependent signal for the phase compatible control of the coils. Such an arrangement is known from the European patent application EP 954 085. A vertical Hall-effect element with several arms serves as the sensor whereby a Hall voltage dependent on the rotational position of the permanent magnet is produced in each arm. The Hall voltages are used to control the coils of the electric motor. The vertical Hall-effect element is sensitive to the components of the magnetic field produced by the permanent magnet which run parallel to the surface of the chip. It has the disadvantage that it can not be realised together with the processing electronics on the same chip because it is based on a special semiconductor technology.

The use of horizontal Hall-effect elements is also known which are sensitive to the components of the magnetic field produced by the permanent magnet which impinge vertically on the surface of the chip. These Hall-effect elements can be integrated into the processing electronics on the same chip. However, this solution has the inherent disadvantage that the Hall-effect elements must be arranged in the area of the edge of the permanent magnet where the vertical component of the magnetic field is largest. In the area of the rotary axis the vertical component is small. Placing of the Hall-effect element is dependent on the dimensions of the permanent magnet. With larger permanent magnets it is then no longer economic to integrate the Hall-effect elements onto one single semiconductor chip.

An angle sensor with a magnetic field sensor element which is based on the magnetoresistive effect is known from the patent U.S. Pat. No. 6,064,197. In order to increase the measurable angle range to over 180°, there is an additional Hall-effect element. However, the Hall-effect element must be positioned in a different location to the magnetic field sensor element as the magnetic field sensor element must measure the horizontally running components of the magnetic field of the rotating permanent magnet while the Hall-effect element must measure the vertical components of the magnetic field. In addition, sensors based on the magnetoresistive effect show hysteresis effects which limit the resolution.

Magnetic field sensors are known from the U.S. patent U.S. Pat. No. 5,942,895 and U.S. Pat. No. 6,184,679 which are sensitive to magnetic fields aligned parallel to the surface of the chip and which can be realised together with the electronics on a semiconductor chip. With such a magnetic field sensor however, only one single component of the magnetic field can be measured.

The object of the invention is to suggest a sensor which no longer has the disadvantages mentioned at the beginning.

BRIEF DESCRIPTION OF THE INVENTION

According to a first aspect of the invention a sensor for the detection of the direction of a magnetic field comprises one single magnetic field concentrator with a flat shape and at least a first Hall-effect element and a second Hall-effect element or at least a first group and a second group of Hall-effect elements, whereby the Hall-effect elements are arranged in the area of the edge of the magnetic field concentrator.

The flat shaped magnetic field concentrator has the task to influence an external magnetic field in such a way that it penetrates the Hall-effect elements in an optimal way.

The Hall-effect elements can be so-called horizontal Hall-effect elements or so-called vertical Hall-effect elements. A horizontal Hall-effect element is sensitive to the component of the magnetic field which impinges vertically on its surface, while a vertical Hall-effect element is sensitive to a component of the magnetic field which runs parallel to its surface. For this reason horizontal Hall-effect elements must be placed below the magnetic field concentrator, vertical Hall-effect elements must be placed in the area beside the edge, outside of the magnetic field concentrator.

According to another aspect of the invention a sensor for the detection of the direction of a magnetic field comprises at least three magnetic field concentrators arranged symmetrically in a plane in relation to a point of symmetry which have, in the area of the point of symmetry, edges facing each other which run parallel to each other, and one Hall-effect element or one group of Hall-effect elements per magnetic field concentrator, whereby the Hall-effect elements are arranged in the area of the parallel running edge of the respective magnetic field concentrator.

In the following, embodiments of the invention are explained in more detail based on the drawing.

BRIEF DESCRIPTION OF THE DRAWING FIGURES

Figure 2:
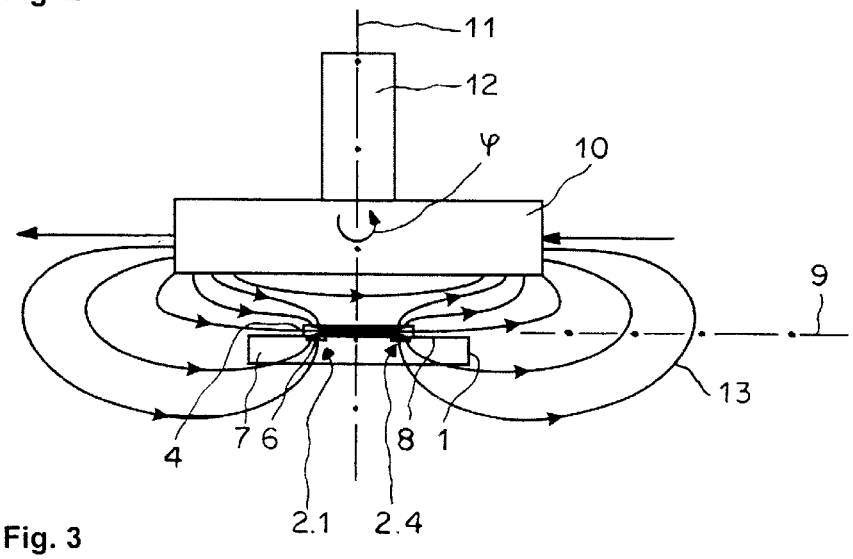
Figure 3:
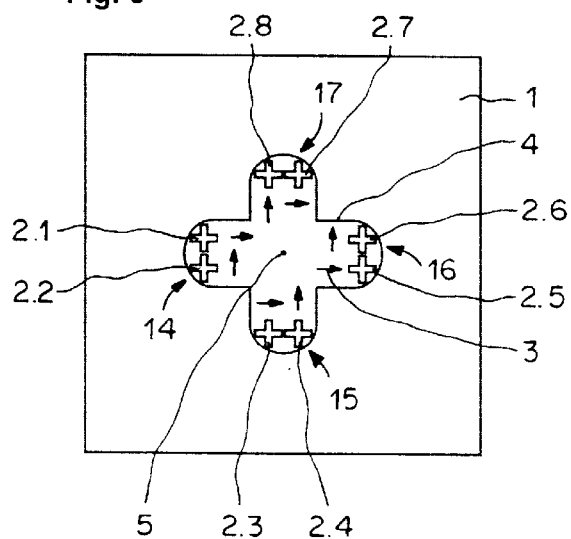
Figure 4:
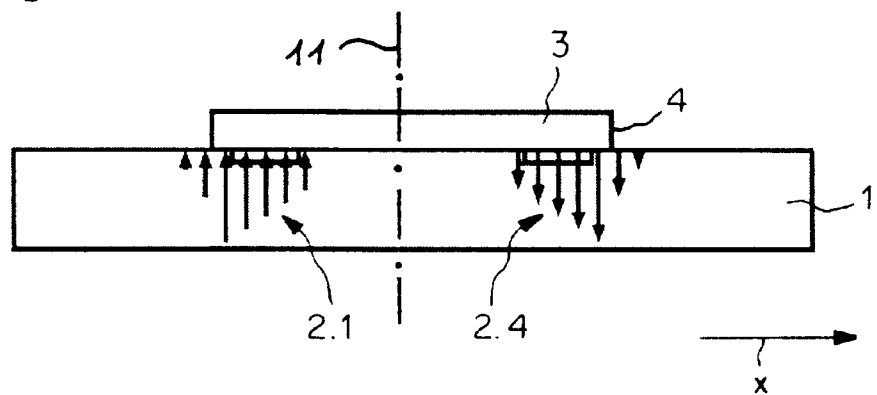
Figure 5:
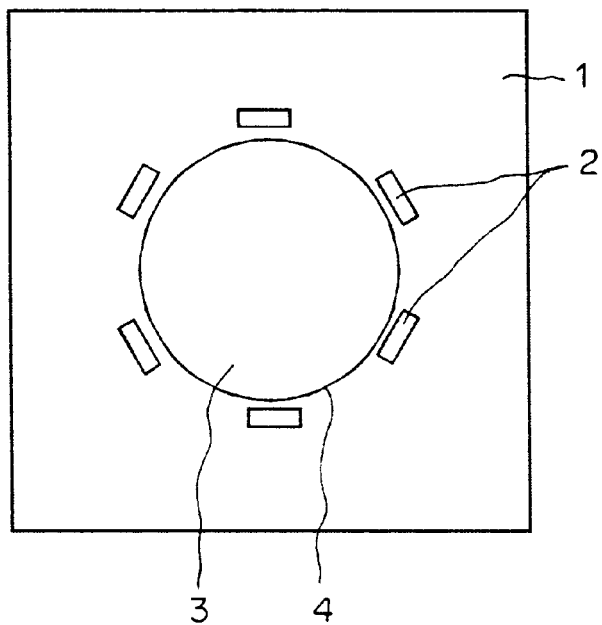
Figure 6:
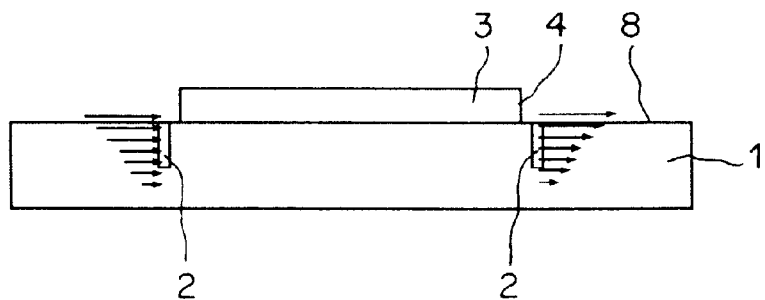

It is shown in:

FIG. 1, a first example of a sensor in accordance with the invention with horizontal Hall-effect elements, FIG. 2 a section through the sensor along the line 1—1 in FIG. 1, FIG. 3 a second example of a sensor in accordance with the invention, FIG. 4 details of the sensor, FIGS. 5, 6 an example of a sensor in accordance with the invention with vertical Hall-effect elements, FIGS. 7a, b sensors in accordance with the invention with which the direction of an external magnetic field can be determined in three dimensions, and FIGS. 8–11 further sensors in accordance with the invention.

DETAILED DESCRIPTION OF THE INVENTION

FIG. 1 shows a plan view of a sensor in accordance with the invention which is suitable, for example, as an angle sensor for the control of a brushless electric motor with three coils. The sensor comprises a semiconductor chip I with six horizontal Hall-effect elements 2.1 to 2.6 and one single magnetic field concentrator 3. With this first example, the magnetic field concentrator 3 is formed disc-shaped and the six Hall-effect elements 2 are arranged distributed at equal distances along the edge 4 of the magnetic field concentrator 3.

The Hall-effect elements 2.1 to 2.6 are realised with a generally known technology, preferably CMOS technology as n-doped well 6 (FIG. 2) in a p-doped substrate 7 (FIG. 2). Horizontal Hall-effect elements are sensitive to the components of the magnetic field which impinge vertically on the surface 8 of the semiconductor chip 1. In the example, the Hall-effect elements 2.1 to 2.6 have a cross-shaped structure whose alignment is preferably parallel to 100 crystal axis so that the influence of changing mechanical stresses on the Hall signal remains as low as possible.

The magnetic field concentrator 3 consists of ferromagnetic material, preferably permalloy or mu-metal or a metal glass which, for example, are available as a tape of around 15 μm to 30 μm thickness. A metal glass with a comparatively low coercitive field strength is preferred so that no Hysteresis effects occur. Furthermore, their magnetization is to a large extent isotropic.

The magnetic field concentrator 3 extends in a plane 9 and has a flat shape, ie, its thickness is considerably less than its extension in the plane. The magnetic field concentrator 3 preferably has an equal thickness. It can however be formed thicker in the middle than at the edge. The magnetic field concentrator 3 therefore works as a concentrator for the components of the magnetic field which lie in the plane 9. The function of the magnetic field concentrator 3 will be explained in more detail based on FIG. 2. In this example, the magnetic field concentrator 3 has a centre of symmetry 5, it is namely rotationally symmetrical.

FIG. 2 shows a section of the sensor along the line 1—1 of FIG. 1 as well as a permanent.magnet 10 producing a magnetic field which, for example, is mounted on the rotational axis 11 of a brushless electric motor 12 with three coils. Within its environment, the magnetic field concentrator 3 alters the course of the field lines 13 of the magnetic field and, in particular, has the effect that the field lines which, in the absence of the magnetic field concentrator 3 would run parallel to the surface 8 of the semiconductor chip 1, penetrate the Hall-effect element 2.1 almost vertically to the surface 8. The relative permeability of the material of the magnetic field concentrator 3 is greater than 1000, while the relative permeability of air and of the semiconductor substrate 7 amount to around 1. Therefore, the field lines are practically always aligned vertical to the surface of the magnetic field concentrator 3. The Hall-effect elements 2.1 to 2.6 are arranged in the area of the lateral edge 4 of the magnetic field concentrator 3 as there the vertical component of the magnetic field is largest.

Hall-effect elements lying diametrically opposed in relation to the centre of symmetry 5 (FIG. 1) form one pair each for production of an output signal whereby the Hall voltage of one Hall-effect element is subtracted from the Hall voltage of the other Hall-effect element. Because the field lines penetrate both Hall-effect elements of a pair in opposing vertical direction, the voltages which are created by the "redirecting" of the magnetic field cumulate while the Hall voltages created, for example, because of an external, magnetic interference field vertically penetrating the Hall-effect elements cancel each other out. Furthermore, technology dependent offset voltages are at least partially compensated. The Hall-effect elements 2.1 and 2.4 therefore together produce the output signal $S_1$, Hall-effect elements 2.2 and 2.5 produce the output signal $S_2$ and the Hall-effect elements 2.3 and 2.6 produce the output signal $S_3$. The strength of the output signals $S_1$, $S_2$ and $S_3$ is dependent on the direction of the magnetic field in the plane 9.

When the permanent magnet 10 rotates around the rotary axis 11, then the magnetic field rotates with it and produces somewhat sinusoidal output signals $S_1$, $S_2$ and $S_3$ which are phase-shifted by 120°. The output signal $S_1$ is always at maximum when the direction of the magnetic field of the permanent magnet 10 is parallel to the axis which connects the two Hall-effect elements 2.1 and 2.4, the output signal $S_2$ is always at maximum when the direction of the magnetic field of the permanent magnet 10 is parallel to the axis which connects the two Hall-effect elements 2.3 and 2.5, etc. As described in the European patent application EP 954085, the output signals $S_1$, $S_2$ and $S_3$ can be used to control the three coils of the electric motor 12.

However, the output signals $S_1$, $S_2$ and $S_3$ can also be used to determine the rotational angle φ of the rotary axis 11 when the electric motor 12 is stationary. Here it is important that, as far as possible, no signals are superimposed on the output signals $S_1$, $S_2$ and $S_3$ which do not originate from the magnetic field of the permanent magnet 10. The suggested example with the respective Hall-effect elements coupled in pairs is particularly suited for this as the influence of external interference fields is mainly eliminated and technology dependent offset voltages are mostly compensated. Technology dependent offset voltages can be further reduced when, instead of the individual Hall-effect elements 2.1 to 2.6, groups of Hall-effect elements comprising two or more Hall-effect elements are used whereby the current directions are different in the various Hall-effect elements of a group.

Such an example is presented in FIG. 3 where four groups 14 to 17 are available each with two Hall-effect elements 2.1 to 2.8. Diametrically opposed groups of Hall-effect elements are coupled in pairs so that the sensor delivers two output signals $S_1$ and $S_2$. This means therefore, that output signal $S_1$ is formed from the Hall voltages of Hall-effect elements 2.1, 2.2, 2.5, and 2.6 and the output signal $S_2$ is formed from the Hall voltages of Hall-effect elements 2.3, 2.4, 2.7 and 2.8. In FIG. 3 the Hall-effect elements are cross-shaped and each Hall-effect element is assigned an arrow which indicates the current direction within the Hall-effect element. With this example, the magnetic field concentrator 3 also has a cross-shaped structure which, as opposed to the circular structure shown in the previous example, leads to a higher concentration of the magnetic field at the location of the Hall-effect elements. This sensor is suited, for example, for the control of an electric motor 12 with two coils. If required, it is possible to store the value of the output signals $S_1$ and $S_2$ as a function of the rotational angle φ. Because the output signals $S_1$ and $S_2$ are phase-shifted, the rotational angle φ can easily be clearly and uniquely determined based on the output signals $S_1$ and $S_2$.

FIG. 4 shows, in a schematic, not to scale presentation in reference to the sensor of the first example, the semiconductor chip 1 with the two integrated Hall-effect elements 2.1 and 2.4 which are diametrically opposed in the plane in relation to the rotary axis 11 (see also Fig. 1) and the circular magnetic field concentrator 3. The strength and direction of the field produced by the permanent magnet 10 (FIG. 2) in the area of the two Hall-effect elements 2.1 and 2.4 is presented with vertical arrows. Shifting of the magnetic field concentrator 3 out of the ideal position in positive x-direction causes a decline in the Hall voltage in Hall-effect element 2.1 and an increase in the Hall voltage in Hall-effect element 2.4. Favourably, the diameter of the magnetic field concentrator 3 is adapted to the distance between the two Hall-effect elements 2.1 and 2.4 so that, with ideal positioning of the magnetic field concentrator 3 in relation to the two Hall-effect elements 2.1 and 2.4, the two Hall-effect elements 2.1 and 2.4 are not located within the zone where the field strength of the magnetic field reaches its maximum: The Hall-effect elements 2.1 and 2.4 are either closer to the centre, as shown in FIG. 4, or placed further away from the centre. In this way, the influence of positioning variations of the magnetic field concentrator 3 in relation to the two Hall-effect elements 2.1 and 2.4 is minimized.

If the sensor only serves the control of an electric motor, whereby the rotational angle when the motor is stationary is not of interest, then it suffices when only one of the Hall-effect element coupled pairs is available. With the first embodiment, these are Hall-effect elements 2.1, 2.2 and 2.3.

Instead of the circular magnetic field concentrator, a magnetic field concentrator with a different, for example polygon, shape can be used. In particular, for photolithographic reasons, it can be advisable, to approach the circular shape by means of a polygon. Equally, the number of Hall-effect elements can be increased.

FIG. 5 shows an embodiment with vertical Hall-effect elements 2. Vertical Hall-effect elements are sensitive to the components of the magnetic field which penetrate the Hall-effect element parallel to the surface 8 of the semiconductor chip 1. A vertical Hall-effect element which can be integrated with the electronics is described for example in the American patent U.S. Pat. No. 5,572,058. The vertical Hall-effect elements 2 are aligned tangentially to the edge 4 of the magnetic field concentrator 3. They are located in the area of the edge 4 of the magnetic field concentrator 3, however not underneath the magnetic field concentrator 3 as with the horizontal Hall-effect elements but laterally offset outside the magnetic field concentrator 3 where the field lines 13 (FIG. 2) of the magnetic field running parallel to the surface 8 of the semiconductor chip 1 are largest.

In FIG. 6, arrows show the strength of the parallel running field lines 13 (FIG. 2) of the magnetic field in the area of the vertical Hall-effect elements 2 whereby the length of the arrows is proportional to the strength of the magnetic field.

The advantages of this solution compared to solutions known from prior art, lie in that a) the position of the Hall-effect elements in relation to the permanent magnet is uncritical because the Hall-effect elements do not have to be placed in the area of the edge of the permanent magnet where the vertical component of the magnetic field is largest, but in the area of the rotational axis where the horizontal components are largest so that placing of the semiconductor chip into which the Hall-effect elements are integrated can take place independently of the position of the edge of the permanent magnet.

b) the magnetic field concentrator additionally amplifies the magnetic field in the area of the Hall-effect elements, c) the Hall-effect elements and the processing electronics can be integrated on the same semiconductor chip, and d) a deviation of the actual position of the magnetic field concentrator from its set position within the usual process tolerances has hardly any influence on the signal produced.

The sensors described are also suitable as angle sensors for the applications described in the U.S. patent U.S. Pat. No. 6,064,197 quoted at the beginning.

FIG. 7a shows a third example of a sensor in accordance with the invention with which the magnetic field concentrator 3 has the shape of a ring. This enables the arrangement of a further horizontal Hall-effect element 2', for example in the centre of the ring, with which the components of the magnetic field which impinge vertically on the Hall-effect element 2' can be measured. Such a sensor is suitable for use in a joystick, for example, as it enables determination of the direction of an external magnetic field in three dimensions.

Because the magnetic field concentrator 3 is very thin, it has practically no influence on the components of the magnetic field which impinge vertically on the Hall-effect element 2'. The sensor presented in FIG. 7b also enables determination of the direction of an external magnetic field in three dimensions. Here however, the danger exists that the vertical components are superimposed on the horizontal components as firstly, the magnetic field concentrator 3 amplifies the horizontal components and, secondly, with deviations of the magnetic field concentrator 3 from its set position, horizontal components of the magnetic field could also penetrate the Hall-effect element 2' in vertical direction.

It should be noted however, that with the example according to FIG. 7a, the magnetic field concentrator 3 can also work as concentrator for the vertical components of the magnetic field namely when the width of the ferromagnetic ring is comparable with its thickness. From the sum of the signals of the two Hall-Effect elements 2.1 and 2.3 or the sum of the signals of the two Hall-effect elements 2.2 and 2.4, a signal can be obtained which is proportional to the vertical components of the magnetic field while from the differential, as demonstrated above, the horizontal components of the magnetic field can be determined. The Hall-effect element 2' can then even be omitted.

An individual Hall-effect element requires a relatively small area of typically some ten*some ten micrometres. The diameter of the circular shaped magnetic field concentrator amounts to around 0.2 mm to 0.5 mm. In the ideal case, the diameter of the magnetic field concentrator is less than the diameter of the permanent magnet which typically amounts to 1.3 mm or more.

Above 20 mT, an external field typically leads to saturation effects in the magnetic field concentrator. When the set distance between the permanent magnet and the sensor is selected so that the magnetic field concentrator is at least partially magnetically saturated, then this has the advantage that the output signals $S_1$, $S_2$, etc. are not or are only slightly dependent on distance fluctuations of the permanent magnet from the sensor.

It is also possible to operate the Hall-effect elements as pulse generators, whereby the rotating permanent magnet produces as many pulses per rotation as there are Hall-effect elements available.

FIG. 8 shows an angle sensor with three magnetic field concentrators 18.1, 18.2 and 18.3 which, as with the sensor in the first example, together with a permanent magnet working as an angle defining element, is suitable as an angle sensor for the control of an electric motor having three coils. The magnetic field concentrators 18 are arranged symmetrically in relation to a point of symmetry 19, namely with a 120° rotational symmetry. A horizontal Hall-effect element 2.1, 2.2 or 2.3 is located in the area of the edge 4 of each magnetic field concentrator facing the point of symmetry 19. The edge 4 of the magnetic field concentrators is divided into two areas, namely an inner area where opposite margins 20 of the magnetic field concentrators 18.1, 18.2 and 18.3 run parallel so that the density of the field lines of the magnetic field is as homogeneous as possible in the gap between the two margins 20 and saturation of the peaks is avoided, and an outer area where the distance between neigbouring magnetic field concentrators is much larger in order to avoid the magnetic field here from "short-circuiting". The outer edge 21 of the magnetic field concentrators 18.1, 18.2 and 18.3 extends over as large an angle area as possible in order to concentrate the external magnetic field as efficiently as possible in the area of the Hall-effect elements 2.1, 2.2 and 2.3 and to avoid saturation peaks which influence the angle dependency of the signals. With this example, each Hall-effect element 2.1, 2.2 and 2.3 delivers an output signal $S_1$, $S_2$ and $S_3$.

Instead of the individual Hall-effect elements 2.1, 2.2 and 2.3, groups of Hall-effect elements can also be foreseen which, amongst themselves, are already offset corrected.

FIGS. 9 and 10 show two further sensors with four magnetic field concentrators 18.1 to 18.4 with which the direction of a magnetic field can be determined in two spatial dimensions. Here, two Hall-effect elements, diametrically opposed to one another in relation to the point of symmetry 19 are coupled as a pair. Together, Hall-effect elements 2.1 and 2.3 produce the output signal $S_1$, Hall-effect elements 2.2 and 2.4 together produce the output signal $S_2$. From the output signals $S_1$ and $S_2$, the direction of the magnetic field in the plane 9 of the sensor can be determined.

With the sensors shown in FIGS. 8 to 10, the magnetic field concentrators have not to be formed flat. They can be formed thicker towards the edge or be coupled to additional external magnetic field concentrators in order to concentrate the magnetic field as efficiently as possible in the area of the Hall-effect elements.

FIG. 11 shows an embodiment with three magnetic field concentrators 18.1, 18.2, 18.3 and three vertical Hall-effect elements 2.1, 2.2, 2.3, each of which is arranged in the centre between the parallel running margins 20 of the neighbouring magnetic field concentrators 18.1, 18.2, 18.3.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A sensor for the detection of the direction of a magnetic field, comprising:
    a magnetic field concentrator having a generally flat shape extending substantially in a first plane,
    a first Hall-effect element or a first group of Hall-effect elements for measuring a first component of the magnetic field in said first plane and a second Hall-effect element or a second group of Hall-effect elements for measuring a second component of the magnetic field in said first plane, wherein the Hall-effect elements are positioned near a peripheral edge of the magnetic field concentrator in a second plane that is substantially parallel to said first plane.

2. A sensor according to claim 1, further comprising a third Hall-effect element or a third group of Hall-effect elements and a fourth Hall-effect element or a fourth group of Hall-effect elements each of which are positioned in said second plane near the peripheral edge of the magnetic field concentrator, and wherein the magnetic field concentrator has a center of symmetry wherein the first Hall-effect element or the first group of Hall-effect elements and the third Hall-effect element or the third group of Hall-effect elements are arranged symmetrically in relation to the center of symmetry, and the second Hall-effect element or the second group of Hall-effect elements and the fourth Hall-effect element or the fourth group of Hall-effect elements are arranged symmetrically in relation to the center of symmetry.

3. Sensor according to claim 2, wherein the Hall-effect elements are horizontal Hall-effect elements that are positioned interior the peripheral edge of the magnetic field concentrator.

4. Use of a sensor according to claim 3 as an angle sensor for determining the rotational position of an object rotatable around a rotary axis, whereby a permanent magnet is secured to the rotary axis, wherein the distance between the sensor and the permanent magnet is selected so that the magnetic field concentrator is magnetically at least partially saturated.

5. Sensor according to claim 2, wherein the Hall-effect elements are vertical Hall-effect elements positioned outside the peripheral edge of the magnetic field concentrator.

6. Use of a sensor according to claim 5 an angle sensor for determining the rotational position of an object rotatable around a rotary axis, whereby a permanent magnet is secured to the rotary axis, wherein the distance between the sensor and the permanent magnet is selected so that the magnetic field concentrator is magnetically at least partially saturated.

7. Sensor according to claim 2, wherein the magnetic field concentrator is made of metal glass.

8. Use of a sensor according to claim 2 as an angle sensor for determining the rotational position of an object rotatable around a rotary axis, whereby a permanent magnet is secured to the rotary axis, wherein the distance between the sensor and the permanent magnet is selected so that the magnetic field concentrator is magnetically at least partially saturated.

9. A sensor according to claim 1, wherein the Hall-effect elements are horizontal Hall-effect elements that are positioned interior the peripheral edge of the magnetic field concentrator.

10. Use of a sensor according to claim 9 as an angle sensor for determining the rotational position of an object rotatable around a rotary axis, whereby a permanent magnet is secured to the rotary axis, wherein the distance between the sensor and the permanent magnet is selected so that the magnetic field concentrator is magnetically at least partially saturated.

11. Sensor according to claim 1, wherein the Hall-effect elements are vertical Hall-effect elements positioned outside the peripheral edge of the magnetic field concentrator.

12. Use of a sensor according to claim 11 as an angle sensor for determining the rotational position of an object rotatable around a rotary axis, whereby a permanent magnet is secured to the rotary axis, wherein the distance between the sensor and the permanent magnet is selected so that the magnetic field concentrator is magnetically at least partially saturated.

13. Sensor according to claim 1, wherein the magnetic field concentrator is made of metal glass.

14. Use of a sensor according to claim 1 as an angle sensor for determining the rotational position of an object rotatable around a rotary axis, whereby a permanent magnet is secured to the rotary axis, wherein the distance between the sensor and the permanent magnet is selected so that the magnetic field concentrator is magnetically at least partially saturated.

15. Sensor for the detection of the direction of a magnetic field, comprising:
    at least three magnetic field concentrators of generally flat shape arranged in a plane symmetrically relative to a point of symmetry, each magnetic field concentrator having an edge facing an edge of a neighbouring magnetic field concentrator, wherein a portion of each of the facing edges are substantially parallel to each other, and
    each of the magnetic field concentrators having a Hall-effect element or a group of Hall-effect elements associated therewith, wherein the Hall-effect elements are arranged near said portion of the edge thereof.

16. Sensor according to claim 15, wherein the Hall-effect elements are horizontal Hall-effect elements.

17. Sensor according to claim 15, wherein the Hall-effect elements are vertical Hall-effect elements.

18. Sensor according to claim 15, wherein the magnetic field concentrators are made of metal glass.

* * * * *